US005747984A

United States Patent [19]

Amft et al.

[11] Patent Number: 5,747,984

[45] Date of Patent: May 5, 1998

[54] SWITCHING COMPONENT FOR DETECTING CONTACT EROSION

[75] Inventors: Dietrich Amft, Chemnitz; David-Walter Branston, Effeltrich; Jörg Kieser, Forchheim; Reinhard Maier, Herzogenaurach, all of Germany

[73] Assignee: Siemens Aktiengesellschaft

[21] Appl. No.: 525,796

[22] PCT Filed: Mar. 10, 1994

[86] PCT No.: PCT/DE94/00244

§ 371 Date: Sep. 22, 1995

§ 102(e) Date: Sep. 22, 1995

[87] PCT Pub. No.: WO94/22153

PCT Pub. Date: Sep. 29, 1994

[30] Foreign Application Priority Data

Mar. 22, 1993 [DE] Germany .......................... 43 09 177.6

[51] Int. Cl.[6] .......................... G01R 31/00; H01H 71/04

[52] U.S. Cl. .......................... 324/71.2; 324/415; 324/537; 324/700; 340/644; 73/86

[58] Field of Search .......................... 324/415, 418, 324/420, 537, 538, 700, 71.2; 340/644; 73/86; 422/53; 204/404

[56] References Cited

U.S. PATENT DOCUMENTS

| | | | |
|---|---|---|---|
| 3,272,949 | 9/1966 | Lawrence | 200/166 |
| 4,225,819 | 9/1980 | Grau et al. | 324/415 |
| 4,479,117 | 10/1984 | Marquardt | 340/644 |
| 4,700,082 | 10/1987 | Oguma et al. | 324/71.2 X |

FOREIGN PATENT DOCUMENTS

| | | |
|---|---|---|
| 0 074 575 | 3/1983 | European Pat. Off. . |
| 1 092 101 | 11/1960 | Germany . |
| 24 05 149 | 8/1975 | Germany . |
| 37 14 802 | 11/1988 | Germany . |

*Primary Examiner*—Vinh P. Nguyen
*Assistant Examiner*—Glenn W. Brown
*Attorney, Agent, or Firm*—Kenyon & Kenyon

[57] ABSTRACT

Switching components with contact parts that are mounted on a contact carrier in a switch housing may include devices for monitoring the contact erosion. The contact carrier may be split (sub-divided) and contact parts can be slotted at the rear and mounted on the sub-divided contact carrier. Thus, the oscillation response (vibration response) of the contact carrier in particular can be used as a measure of the erosion of the contact parts.

24 Claims, 3 Drawing Sheets

SWITCHING COMPONENT FOR DETECTING CONTACT EROSION

BACKGROUND OF THE INVENTION

The present invention relates to a switching component, and particularly relates to a safety switch or a power switch, with contact parts attached to a contact carrier, including a portion for detecting contact erosion.

In switching components, burning erosion occurs on the contact parts with each switching operation. Depending on the stress due to the current or voltage, this erosion ultimately leads to failure of the switching component. This is especially true when switching short-circuit currents in power switches, because the resulting arcs cause an especially great erosion of the contact surfaces.

Erosion mainly limits the lifetime of a switch. Currently, the contact parts or even the entire switch must be routinely replaced after a certain lifetime, regardless of whether there has actually been any considerable amount of erosion of the contact parts.

Several proposals in the state of the art have been made that would permit monitoring of the erosion of contact parts, such as detecting contact erosion using accessory electric, mechanical or X-ray equipment. For example, German patent (ALS) 2,405,149 discloses a switching component where the change in switch travel length due to contact erosion is detected. In order to achieve a reliable display of the contact erosion, however, a relatively complicated mechanical design is necessary.

In addition, German patent (OLS) 3,714,802 discloses an electric switch in which at least one of the contact parts is provided with an optical fiber whose transmission properties can be measured externally by means of suitable optical equipment. Due to an appropriate arrangement of the optical fiber, excessive contact erosion leads to destruction of the optical fiber and thus to a change in the optical transmission properties. However, introducing optical fibers into the contact parts to be applied to the contact carriers requires an additional production step. Therefore, such contact parts including incorporated optical fibers are also expensive and difficult to handle as a part of integrated production of switching components.

SUMMARY OF THE INVENTION

The present invention relates to a switching component including other devices for monitoring the contact erosion. In the switch according to the present invention, the end of the lifetime of the contact parts can be predicted without interrupting the operation of the switch or having to open the switch housing.

In the present invention, the contact carrier is split (subdivided) and the contact parts are slotted at the rear and are mounted on the split contact carrier. The contact carrier is preferably split asymmetrically and the contact parts are preferably slotted asymmetrically at the rear. Both moving and fixed contact carriers can be used with the contact parts in this regard.

In the switching device according to the present invention, the contact carriers that are joined together when the contact parts are new become separated when contact erosion becomes great enough. The resulting change in physical conditions can be detected easily. The detection may take place on the basis of the oscillational behavior (vibrational behavior) of the contact bridge by mounting an oscillation sensor (vibration sensor) on the contact bridge or mounting a microphone in the housing. As another example, the voltage between the two contact carriers can be measured to provide a signal for contact erosion at least during the switching operation.

In the present invention, it is especially advantageous that the prerequisites for detecting contact erosion may be created merely by a slight change in the design of the contact carrier and the respective contact parts. The sensors can be mounted inside the switch housing or on the outside of the switch housing.

BRIEF DESCRIPTION OF THE DRAWINGS

Additional details and advantages of the present invention may be derived from the following description of embodiments of the invention in conjunction with the attached drawings.

DETAILED DESCRIPTION

Identical parts in the figures are provided with the same reference numbers. FIGS. 1 to 3 and 5 are shown as perspective views and FIG. 4 illustrates a side view. The figures are described together to some extent.

Figure 1:
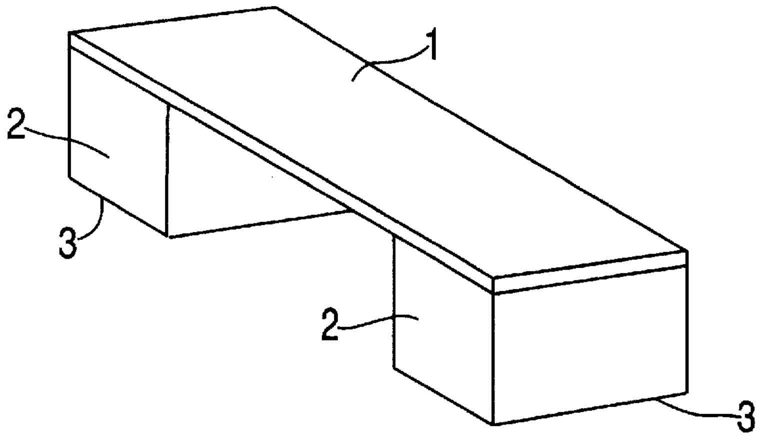
FIG. 1 PRIOR ART
FIG. 1 illustrates a contact carrier with a traditional design.

FIG. 1 illustrates a contact carrier 1 with a contact part 2 attached to each end. Contact parts 2 together with contact carrier 1 may form a movable contact bridge that is mounted inside a switch housing in such a way that contact is made by moving the contact bridge. Contact surface 3 of contact parts 2 (in other words, the contact surface opposite contact carrier 1) is brought in contact with mating contacts (not shown in FIG. 1), which contact constitutes a switching operation.

With such electric switching operations, the contact material necessarily erodes due to the electric arcs and the contact parts wear away. Since the actual wear on the contact parts cannot be detected from outside the switch housing and becomes apparent only when the switch fails completely, such contact parts or even complete switches are currently replaced after a certain period of operation. The allowed operating times of switching components are usually assumed to be so short that, even under intense loads, malfunctioning of the switch can be practically ruled out during its service life.

Figure 2:
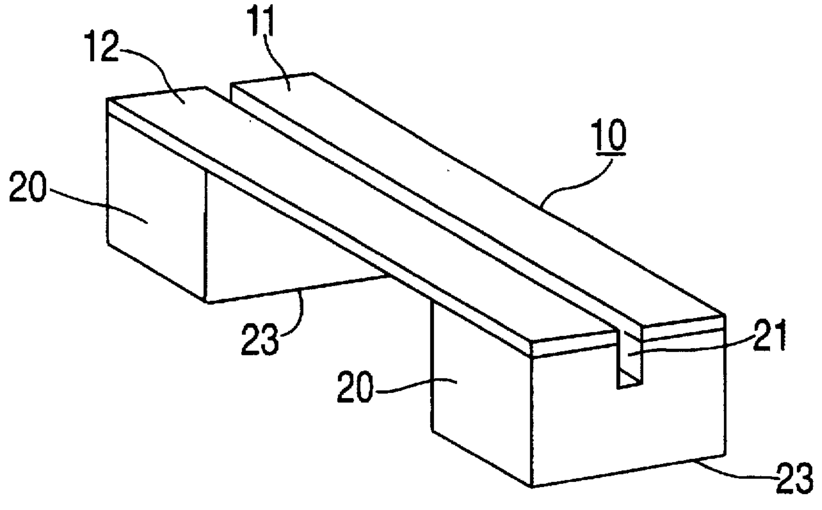
FIG. 2 illustrates a type of contact carrier according to an embodiment of the present invention with the respective contact parts.

According to FIG. 2, a contact carrier 10 is made of two parallel carrier parts 11 and 12. The respective contact parts 20 are provided with a slot 21 at the rear and are attached in a slotted condition on carrier parts 11 and 12. When it is new, switch surface 23 of the contact parts is designed like switch surface 3 of contact parts 2.

Figure 5:
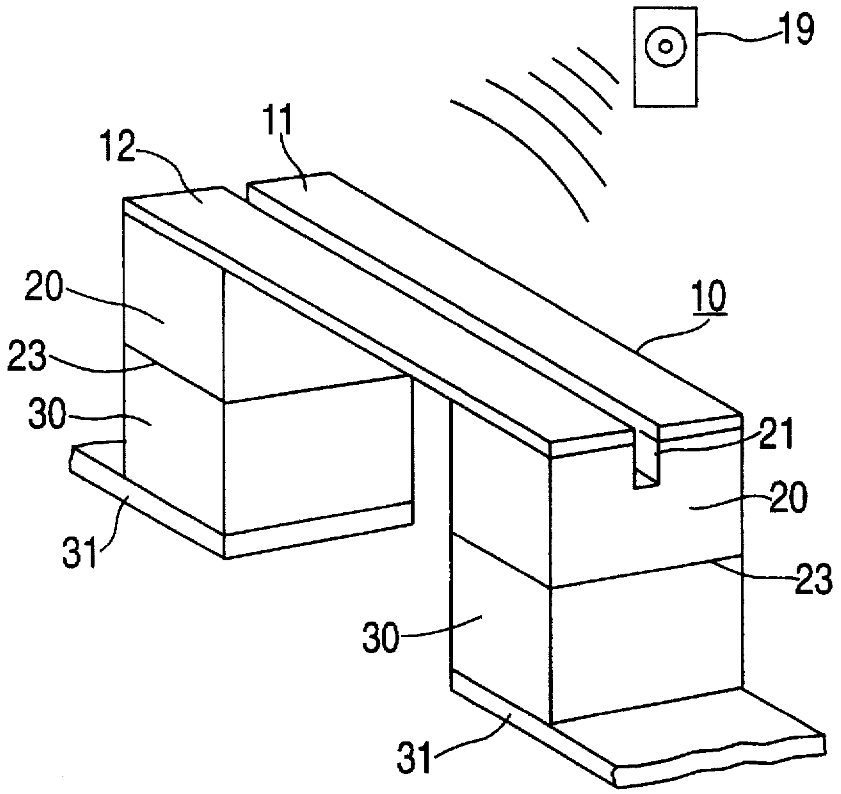
FIG. 5 illustrates another possibility for analysis of the switching component according to FIG. 2.

The physical conditions of contact carrier 10 change in accordance with the erosion of contact parts 20. Specifically, the oscillation response of contact carrier 10 with the two carrier parts 11 and 12 without any erosion of contact parts 20 will be different from the oscillation response of contact carrier 10 with carrier parts 11 and 12 that are separated due to erosion of contact parts 20. The oscillation response in particular can be detected by means of an oscillation sensor on the contact bridge, for example. As an alternative, a microphone 19 may be mounted in the switch housing, as shown in FIG. 5.

To amplify the difference in oscillation response when contact parts 20 are new and when they are eroded, the gap in contact carrier 10 may also be positioned asymmetrically. The detection results are then less ambiguous because there are two different frequencies in the oscillation response when carrier parts 11 and 12 have different widths.

FIG. 2 illustrates the splitting (sub-division) of contact carrier 10 into carrier parts 11 and 12 and the slotting of the respective contact parts on the movable contact. It is possible to apply the principle of sub-division or slotting in a corresponding fashion to the fixed contacts which are also mounted on suitably designed contact carriers and to design all contact parts so they are slotted. The detection sensitivity may be improved in this way.

As an alternative to detection of the oscillation response, the voltage between the two parts 11 and 12 of contact carrier 10 in FIG. 2 can be measured, because when contact erosion has reached a sufficient extent, a measurable voltage signal occurs at least during the switching operation, and this signal can be analyzed.

Figure 3:
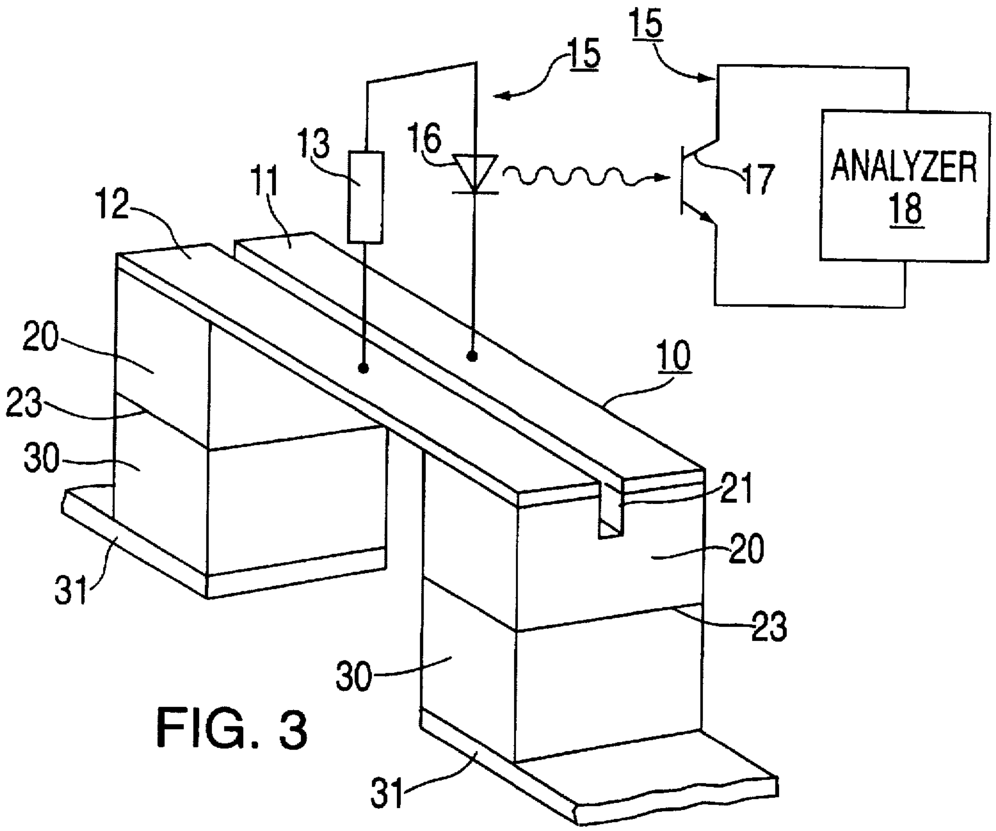
FIG. 3 and FIG. 4 illustrate two different possibilities for analysis with a contact carrier according to FIG. 2.
Figure 4:
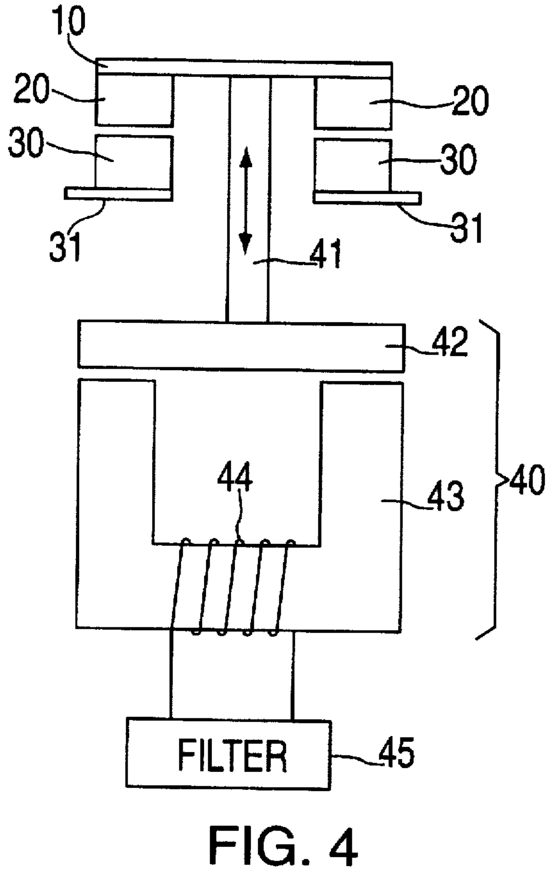

FIG. 3 illustrates contact carrier 10 in a perspective view with the split carrier parts 11 and 12 and contact parts 20 according to FIG. 2 in contact with fixed contact parts 30 on contact carriers 31 (only partially indicated) by means of which one phase of a line system, for example, is switched. In this arrangement, the rear of carrier parts 11 and 12 is short-circuited across a resistor 13 and a photodiode 16. The photodiode 16 is paired with a phototransistor 17 in the housing. Due to such a switching, the voltage signal generated between carrier parts 11 and 12 when contact parts 20 are eroded can be delivered directly as an optical signal as an indication that switch parts 20 are worn out. Accordingly, the voltage signal can be sent to an analyzer 18 by way of the potential-dividing optical coupler 15 formed by photodiode 16 and phototransistor 17.

FIG. 4 illustrates a side view of contact carrier 10 designed according to FIG. 2 with carrier parts 11 and 12 and contact parts 20, with the respective fixed contact parts 30 on contact carriers 31. The resulting switch bridge is usually operated by an electromagnet 40 with armature 42 and yoke 43 for the switching operation. Therefore, an operating rod 41 is connected to armature 42 which is opposite to yoke 43 of electromagnet 40. Yoke 43 of electromagnet 40 has a coil 44 for electric operation. It has been found that the oscillation of contact carrier 10 is manifested as harmonic oscillations in the coil current of operating magnet 40. When the oscillation response of contact carrier 10 changes due to the erosion of contact parts 20, ultimately resulting in two carrier parts 11 and 12 oscillating separately, the frequencies of the harmonics in the coil current also change. These frequencies can be detected by suitable filters 45.

No additional measurement devices are necessary for detecting the oscillation response of the contact carrier in FIG. 4 in particular. This further simplifies the design.

We claim:

1. A switching component comprising:
   - at least two contact parts mounted on a contact carrier in a switch housing; and
   - means for monitoring contact erosion of the at least two contact parts, the means for monitoring being coupled to the contact carrier,
   - wherein the contact carrier is divided and the at least two contact parts are slotted at a rear side thereof and are mounted on the divided contact carrier.

2. A switching component according to claim 1, wherein the switching component is used on a moving contact carrier and respective contact parts.

3. A switching component according to claim 1, wherein the switching component is used on a fixed contact carrier and respective contact parts.

4. A switching component according to claim 1, wherein the means for monitoring detects an oscillation response of the contact carrier during the switching operation.

5. A switching component according to claim 4, wherein the means for monitoring includes an oscillation sensor mounted on the contact carrier.

6. A switching component according to claim 4, wherein the means for monitoring includes a microphone mounted on the switch housing.

7. A switching component according to claim 1, wherein the means for monitoring includes means for measuring and displaying an electric voltage between the two divided contact carriers.

8. A switching component according to claim 7, further comprising a photodiode displaying the contact erosion.

9. A switching component according to claim 8, further comprising:
   - a phototransistor connected downstream from the photodiode, wherein the photodiode serves as an optical coupler for potential division of the measurement voltage supplied to an analyzer when the contact parts are eroded.

10. A switching component according to claim 1, further comprising:
    - an electromagnet initiating the switching operation, and
    - means for detecting harmonics manifested in the coil current of the electromagnet, wherein the harmonics are a signal relating to the oscillation state of the contact carrier.

11. A switching component according to claim 10, further comprising:
    - at least one filter for detecting the harmonics manifested in the coil current of the electromagnet.

12. A switching component according to claim 1, wherein said switching component comprises a safety switch.

13. A switching component according to claim 1, wherein said switching component comprises a power switch.

14. A switching component according to claim 1, wherein the contact carrier is asymmetrically divided and the at least two contact parts are asymmetrically slotted at the rear side.

15. A switching component according to claim 14, wherein the switching component is used on a moving contact carrier and respective contact parts.

16. A switching component according to claim 14, wherein the switching component is used on a fixed contact carrier and respective contact parts.

17. A switching component according to claim 14, wherein the means for monitoring detects an oscillation response of the contact carrier during the switching operation.

18. A switching component according to claim 17, wherein the means for monitoring includes an oscillation sensor mounted on the contact carrier.

19. A switching component according to claim 17, wherein the means for monitoring includes a microphone mounted on the switch housing.

20. A switching component according to claim 14, wherein the means for monitoring includes means for measuring and displaying an electric voltage between the two divided contact carriers.

21. A switching component according to claim 20, further comprising a photodiode displaying the contact erosion.

22. A switching component according to claim 21, further comprising:

a phototransistor connected downstream from the photodiode, wherein the photodiode serves as an optical coupler for potential division of the measurement voltage supplied to an analyzer when the contact parts are eroded.

23. A switching component according to claim 14, further comprising:

an electromagnet initiating the switching operation; and means for detecting harmonics manifested in the coil current of the electromagnet, wherein the harmonics are a signal relating to the oscillation of the contact carrier.

24. A switching component according to claim 23, further comprising:

at least one filter for detecting the harmonics manifested in the coil current of the electromagnet.

* * * * *